(12) United States Patent
Watanabe et al.

(10) Patent No.: US 8,222,737 B2
(45) Date of Patent: *Jul. 17, 2012

(54) BGA SEMICONDUCTOR DEVICE HAVING A DUMMY BUMP

(75) Inventors: Yuji Watanabe, Tokyo (JP); Hisashi Tanie, Ibaraki (JP); Koji Hosokawa, Tokyo (JP); Mitsuaki Katagiri, Tokyo (JP); Ichiro Anjo, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 89 days.

This patent is subject to a terminal disclaimer.

(21) Appl. No.: 12/846,120

(22) Filed: Jul. 29, 2010

(65) Prior Publication Data
US 2010/0295179 A1 Nov. 25, 2010

Related U.S. Application Data (63) Continuation of application No. 11/105,546, filed on Apr. 14, 2005, now Pat. No. 8,164,186.

(30) Foreign Application Priority Data

Apr. 16, 2004 (JP) .................................. 2004-122011

(51) Int. Cl.
*H01L 23/48* (2006.01)

(52) U.S. Cl. ........ 257/735; 257/738; 257/747; 257/737; 257/780; 257/E21.511; 257/E23.069

(58) Field of Classification Search .................. 257/735, 257/738, 747, 737, 780, 778, E21.511, E23.069
See application file for complete search history.

(56) References Cited

U.S. PATENT DOCUMENTS

| | | | |
|---|---|---|---|
| 6,303,878 B1 | 10/2001 | Kondo et al. | |
| 6,736,306 B2 * | 5/2004 | Byun et al. | 228/180.22 |
| 6,750,551 B1 | 6/2004 | Frutschy et al. | |
| 2003/0060035 A1 * | 3/2003 | Kimura et al. | 438/626 |
| 2005/0167831 A1 | 8/2005 | Tsubosaki | |

FOREIGN PATENT DOCUMENTS

JP    2001-68594 A    3/2001

* cited by examiner

*Primary Examiner* — Junghwa M Im
(74) *Attorney, Agent, or Firm* — Sughrue Mion, PLLC (57) ABSTRACT

A BGA semiconductor device includes a semiconductor package and a mounting board mounting thereon the semiconductor package, wherein an array of signal electrodes of the semiconductor package and an array of signal electrodes of the mounting board are coupled together via signal bumps. The BGA semiconductor device also includes a dummy bump, which reinforces the bending strength of the BGA semiconductor device and is broken by a shearing force caused by thermal expansion to alleviate the stress for the signal bumps.

7 Claims, 11 Drawing Sheets

BGA SEMICONDUCTOR DEVICE HAVING A DUMMY BUMP

This is a continuation of application Ser. No. 11/105,546 filed Apr. 14, 2005, which claims priority from Japanese Patent Application No. 2004-122011 filed Apr. 16, 2004. The entire disclosures of the prior applications are considered part of the disclosure of the accompanying continuation application and are hereby incorporated by reference.

BACKGROUND OF THE INVENTION (a) Field of the Invention

The present invention relates to a BGA (ball gird array) semiconductor device having a dummy bump and a method for manufacturing the same and, more particularly, to the structure of a BGA semiconductor device in which a semiconductor package and a wiring board are coupled together using a BGA technique.

(b) Description of the Related Art

A BGA technique is known in the art in which a semiconductor package including therein an IC chip is mounted on a wiring board (mounting board) by using an array of ball pins. The BGA technique has advantages of an increased number of package pins and a smaller size of the semiconductor package, which is substantially equivalent to the chip size. The semiconductor device including a semiconductor package and a mounting board coupled together via the BGA is referred to as a BGA semiconductor device in this text. Due to the advantages as described above, the BGA semiconductor devices are increasingly used in portable electronic equipment, such as a mobile telephone, which are ever required to reduce the dimensions thereof.

Figure 11A:
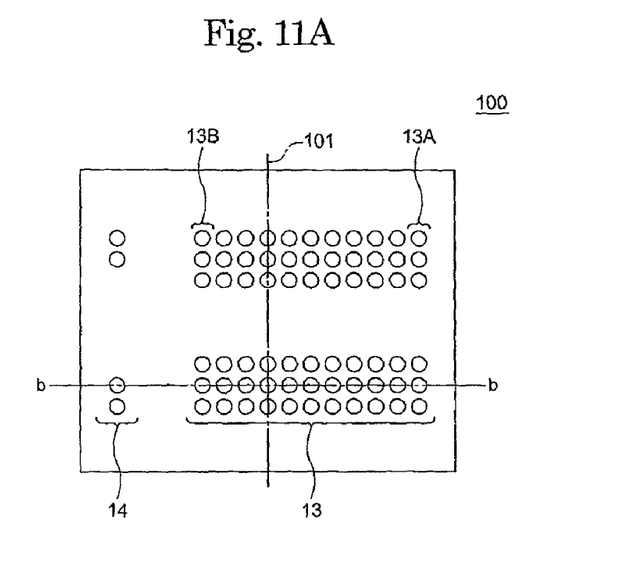
FIG. 11A is a top plan view of arrangement of signal bumps in a conventional BGA semiconductor.

A variety of pin arrangements are generally used in the current BGA semiconductor devices depending on the bit length of the signals used therein. For the purpose of making standards for the pin arrangements, there are some BGA semiconductor devices in which the center of the pin array is deviated from the center of the semiconductor package depending on the bit length. FIG. 11A shows an example of this type of pin arrangement of the conventional BGA semiconductor device, which is generally designated by numeral 100. In the drawing, the center of the array of ball pins (signal ball pins) 13 is deviated from the central line 101 of the semiconductor package.

Figure 11B:
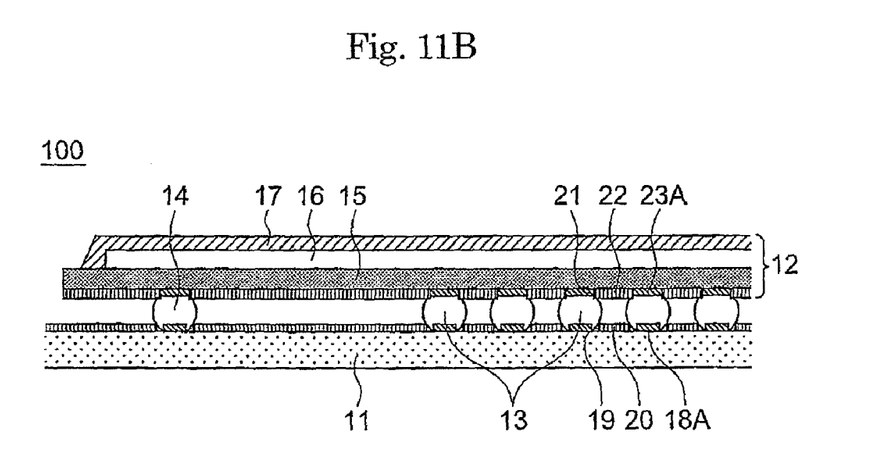
FIG. 11B is a sectional view taken along line b-b in FIG. 11A.

FIG. 11B shows a sectional view of the BGA semiconductor device of FIG. 11A, taken along line b-b in FIG. 11A. The BGA semiconductor device 100 includes a mounting board 11 and a semiconductor package 12 mounted thereon. The semiconductor package 12 includes therein a package substrate 15, an IC chip 16 mounted thereon, and a resin body 17 encapsulating the IC chip 16 on the package substrate 15.

An array of lands (or electrodes) 18 are formed on the mounting board 11 corresponding to the array of ball pins 13, the lands 18 being exposed from respective openings 19 of a solder resist film 20 formed on the mounting board 11. An array of lands (electrodes) 23A are also formed on the package substrate 15 for mounting thereon the ball pins 13, the lands 23A being exposed from openings 21 of a solder resist film 22 formed on the package substrate 15.

The ball pins include the signal ball pins or signal bumps 13 as described above, and also include dummy ball pins (dummy bumps) 14, which are disposed for reinforcing the bending strength of the BGA semiconductor device 100 including the mounting board 11 and the semiconductor package 12. The dummy bumps 14 are disposed in the vicinity of the periphery of the BGA semiconductor device 100 where the signal bumps 13 are not disposed. In this example of the BGA semiconductor device 100, a fan-in structure is employed wherein all the bumps 13 and 14 are disposed just below the IC chip 16.

It is noted that the mounting board 11, which is configured by an insulator such as epoxy resin and wiring patterns, has a thermal expansion coefficient different from that of the semiconductor package 12, with the result that the bumps 13 and 14 are subjected to stresses caused by heat cycles during fabrication or use of the semiconductor device 100. The stress applied to the bumps 13 and 14 is generally in proportion to a product of the distance between bumps and the thermal expansion coefficient, and accordingly, a maximum stress is applied to the bumps disposed in the vicinities of the corners of the BGA semiconductor device 100. If a signal bump 13A in the vicinity of a corner is damaged and broken down by the maximum stress, the BGA semiconductor device 100 cannot perform a normal operation.

Figure 13:
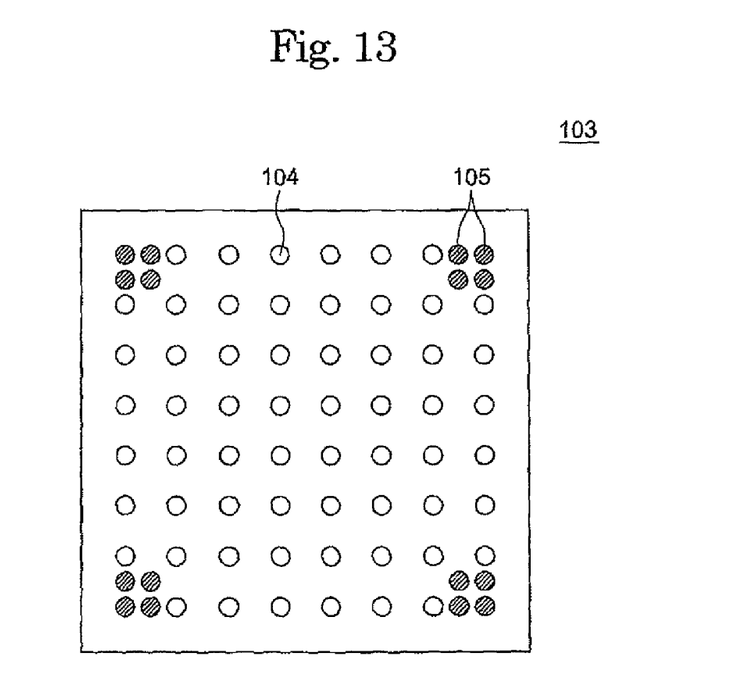
FIG. 13 is a top plan view of arrangement of signal bumps in a conventional BGA semiconductor device described in a patent publication.

JP Patent Appln. Publication 2001-68594 describes a technique for preventing the break-down of the signal bump in the vicinity of the corner of the BGA semiconductor device. The described technique uses a reinforcement land (pad) and a reinforcement dummy bump for increasing a shearing strength of signal bumps in the vicinities of corners of the semiconductor device. FIG. 13 shows the configuration of the BGA semiconductor device described in the patent publication, wherein four dummy bumps 105 are provided in each corner of the BGA semiconductor device 103 instead of disposing a single signal bump 104. The dummy bump 105 is bonded onto a reinforcement land formed on the mounting board and onto another reinforcement land formed on the semiconductor package.

It is noted in the present invention that the technique described in the patent publication may rather cause a larger stress on the signal bumps 104 due to the reinforcement itself provided by the reinforcement bumps 105, the larger stress being caused by the ununiform arrangement of the bumps.

SUMMARY OF THE INVENTION

In view of the above, it is an object of the present invention to provide a BGA semiconductor device which is capable of preventing the signal bumps from being broken, by using another approach to the stress and the reinforcement.

The present invention provides, in a first aspect thereof, a ball-grid-array (BGA) semiconductor device including: a semiconductor package having an array of first signal electrodes; a mounting board having an array of second signal electrodes, each of the second electrodes being bonded onto a corresponding one of the first signal electrodes via a signal bump; and a dummy bump fixed onto one of the semiconductor package and the mounting board and substantially not fixed onto the other of the semiconductor package and the mounting board.

The present invention also provide, in a second aspect thereof, a ball-grid-array (BGA) semiconductor device including: a semiconductor package having an array of first signal electrodes and a first dummy electrode; a mounting board having an array of second signal electrodes and a second dummy electrode; an array of signal bumps, each of the signal bumps being fixed onto a corresponding one of the first signal electrodes via a first bonded surface having a first shearing strength and fixed onto a corresponding one of the second signal electrodes via a second bonded surface having a second shearing strength; and a dummy bump fixed onto the first dummy electrode via a third bonded surface having a third shearing strength and fixed onto the second dummy electrode via a fourth bonded surface having a fourth shearing strength, wherein a relationship between the shearing strengths is such that the third shearing strength is smaller than the first shearing strength, and/or the fourth shearing strength is smaller than the second shearing strength.

The present invention further provides, in a third aspect thereof, a ball-grid-array (BGA) semiconductor device including: a semiconductor package having an array of first signal electrodes and a first dummy electrode; a mounting board having an array of second signal electrodes and a second dummy electrode; an array of signal bumps, each of the signal bumps being fixed onto a corresponding one of the first signal electrodes via a first bonded surface having a first shearing strength and fixed onto a corresponding one of the second signal electrodes via a second bonded surface having a second shearing strength; and a dummy bump fixed onto the first dummy electrode via a third bonded surface having a third shearing strength and fixed onto the second dummy electrode via a fourth bonded surface having a fourth shearing strength, wherein a relationship between the shearing strengths is such that the third shearing strength is smaller than the first shearing strength, and/or the fourth shearing strength is smaller than the second shearing strength.

The present invention further provides, in a fourth aspect thereof, a method for manufacturing a ball-grid-array (BGA) semiconductor device including the steps of: forming a semiconductor package having an array of first signal electrodes and a first dummy electrode; forming a mounting board having an array of second signal electrodes and a second dummy electrode; bonding together the semiconductor package and the mounting board by coupling together the first signal electrodes and the respective second signal electrodes via respective signal bumps and coupling together the first dummy electrode and the second dummy electrode via a dummy bump; and breaking the coupling between the first dummy electrode and the second dummy electrode.

In accordance with the BGA semiconductor device according to the present invention, and a BGA semiconductor device manufactured by the method of the present invention, the dummy bump increases the bending strength of the BGA semiconductor device and does not increase the stress applied to the signal bumps by, for example, a thermal expansion. This advantage can be obtained either fixing the dummy bump with a smaller shearing strength or not fixing the dummy bump onto the semiconductor package or the mounting board.

The above and other objects, features and advantages of the present invention will be more apparent from the following description, referring to the accompanying drawings.

PREFERRED EMBODIMENTS OF THE INVENTION

Before describing the preferred embodiments of the present invention, the principle of the present invention will be described, with reference to the structure shown in FIGS. 11A and 11B, for a better understanding of the present invention.

In the BGA semiconductor device 100, the break-down of the dummy bump 14, if it occurs, does not cause any electrical malfunction because the dummy bump 14 does not configure an electric connection. There is a possibility that, if the dummy bump 14 is broken before the break-down of a signal bump 13A disposed in the vicinity of a corner, the difference in the amount of thermal expansion between the mounting board 11 and the semiconductor package 12 may be reduced by an amount corresponding to the distance between the subject signal bump 13A and a signal bump 13B which opposes the subject signal bump 13A in the array of signal bumps 13. The reduction of the difference in the amount of thermal expansion may possibly reduce the plastic strain between the mounting board 11 and the semiconductor package 12, to thereby alleviate the thermal stress applied to the subject signal bump 13A in the vicinity of the corner. For demonstrating this assumption, a simulation was conducted, as described hereinafter.

Figure 12:
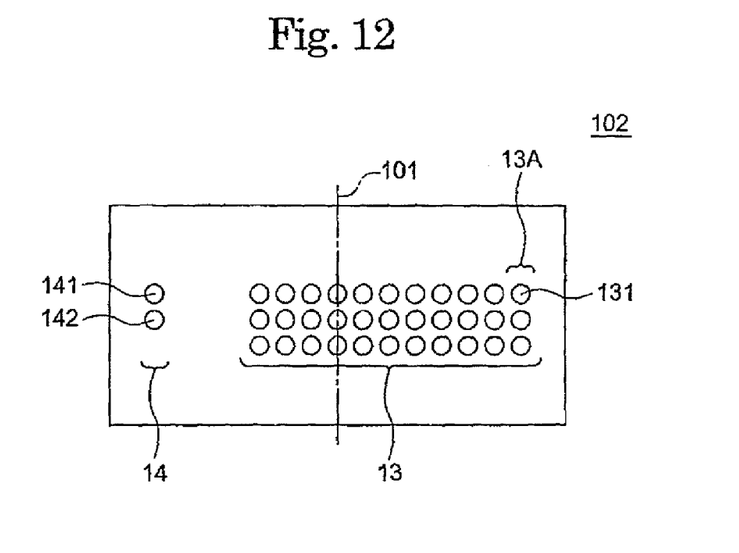
FIG. 12 is a top plan view of arrangement of signal bumps used in a simulation.

In this simulation, a sample of the BGA semiconductor device is assumed having the structure shown in FIG. 12, wherein the bumps are disposed in an ununiform arrangement. The BGA semiconductor device 102 shown in FIG. 12 is obtained by roughly bisecting the structure shown in FIG. 11A. In the BGA semiconductor device 102, it is assumed that all the lands or electrodes, which are formed on the mounting board and the semiconductor package for mounting thereon the bumps 14, have a diameter of 0.50 mm. The simulation is such that a large number of heat cycles, in which the ambient temperature is iteratively changed between −25° C. and 125° C., are applied to the BGA semiconductor device 102, and the number of the heat cycles is investigated after which a break-down of the signal bumps 13 is found.

The simulation thus conducted provided the ranges of plastic strains for the dummy bumps 141 and 142 as well as for the signal bump 13A in the vicinity of a corner, and the estimated lifetime of the signal bump 13A in the vicinity of the corner. The simulation also provided the range of plastic strain for the signal bump 13A and the estimated lifetime thereof for the case of a BGA semiconductor device wherein the dummy bumps 141 and 142 are not disposed.

It is to be noted that the term "range of plastic strain" as used herein means an expansion or contraction per unit length of a sample within a plastic deformation caused by a single-time load, under the condition where the load is applied to the sample for a plurality of times. By this definition, a larger range of plastic strain of a bump means that a larger strain is applied to the bump. The result of the simulation is shown in Table-1. Table-1

|  |  |  | Range of solder plastic strain (%) | | |
| --- | --- | --- | --- | --- | --- |
|  | Sample | Initial state | After break-down of first dummy bump | After break-down of second dummy bump | Estimated lifetime (cycles) |
| With dummy bumps | First dummy bump | 3.95 | — | — | 630 |
|  | Second dummy bump | 3.27 | 4.01 | — | 830 |
|  | Signal bump | 2.86 | 2.78 | 2.63 | 1300 |
| Without dummy bumps | Signal bump | 2.63 | — | — | 1450 |

As shown in Table-1, in the initial state of the sample of BGA semiconductor device including first and second dummy bumps, the first dummy bump 141, the second dummy bump 142 and the signal bump 13A have the ranges of plastic strain descending in this recited order in magnitude. In this initial state, each of these bumps has a unique range of plastic strain at the room temperature. This is because the mounting board and the semiconductor package are fixed together at a higher temperature of 230° C. or above, i.e., the melting point of the solder, and then cooled to the room temperature, resulting in different amounts of plastic deformation between the mounting board and the semiconductor package, to generate different ranges of plastic strain depending on the locations of the bumps and thus differences in the thermal expansion between the bumps.

By applying the heat cycles in the simulation, the first dummy bump 141 having a maximum range of plastic strain in the initial state was first broken after 630 heat cycles, with the result that the second dummy bump 142 had a higher range of plastic strain and that the signal bump 13A in the vicinity of corner had a lower range of plastic strain. By continuing the heat cycles, the second dummy bump 142 was broken after 830 heat cycles, with the result that the signal bump 13A had a further lower range of plastic strain. By further continuing the heat cycles, the signal bump 13A in the vicinity of corner was broken after 1300 heat cycles.

On the other hand, in the BGA semiconductor device having no dummy bumps, the signal bump 13A in the vicinity of corner has a lower range of plastic strain in the initial state compared to the signal bump 13A in the BGA semiconductor device having first and second dummy bumps 141 and 142. During repeating the heat cycles, the signal bump 131 was broken after 1450 heat cycles, which is 150 cycles longer compared to the case of signal bump 13A in the BGA semiconductor device having the first and second dummy bumps 141 and 142. In this simulation, the estimated lifetimes were determined by the Coffin-Manson rule applied with parameters obtained from the results of experiments.

It is confirmed from the above simulation that the signal bump 13A in the vicinity of corner has a lower range of plastic strain after the break-down of the first and second dummy bumps 141 and 142, and that the signal bump 13A in the BGA semiconductor device having no dummy bumps has a longer estimated lifetime compared to the signal bump 13A in the BGA semiconductor device having first and second dummy bumps 141 and 142. In other word, it is confirmed that the dummy bumps 141 and 142 accelerate the break-down of the signal bump 13A in the vicinity of corner caused by the heat cycles, although the dummy bumps 141 and 142 have a function for increasing the mechanical strength against the bending force.

In view of the results of the above simulation, the present invention adopts the configuration, wherein the dummy bumps are broken beforehand in a sense, and/or the dummy bumps have a structure which is easy to break, to thereby prevent the signal bumps in the vicinity of a corner from being broken by the heat cycles, as detailed hereinafter.

Figure 1:
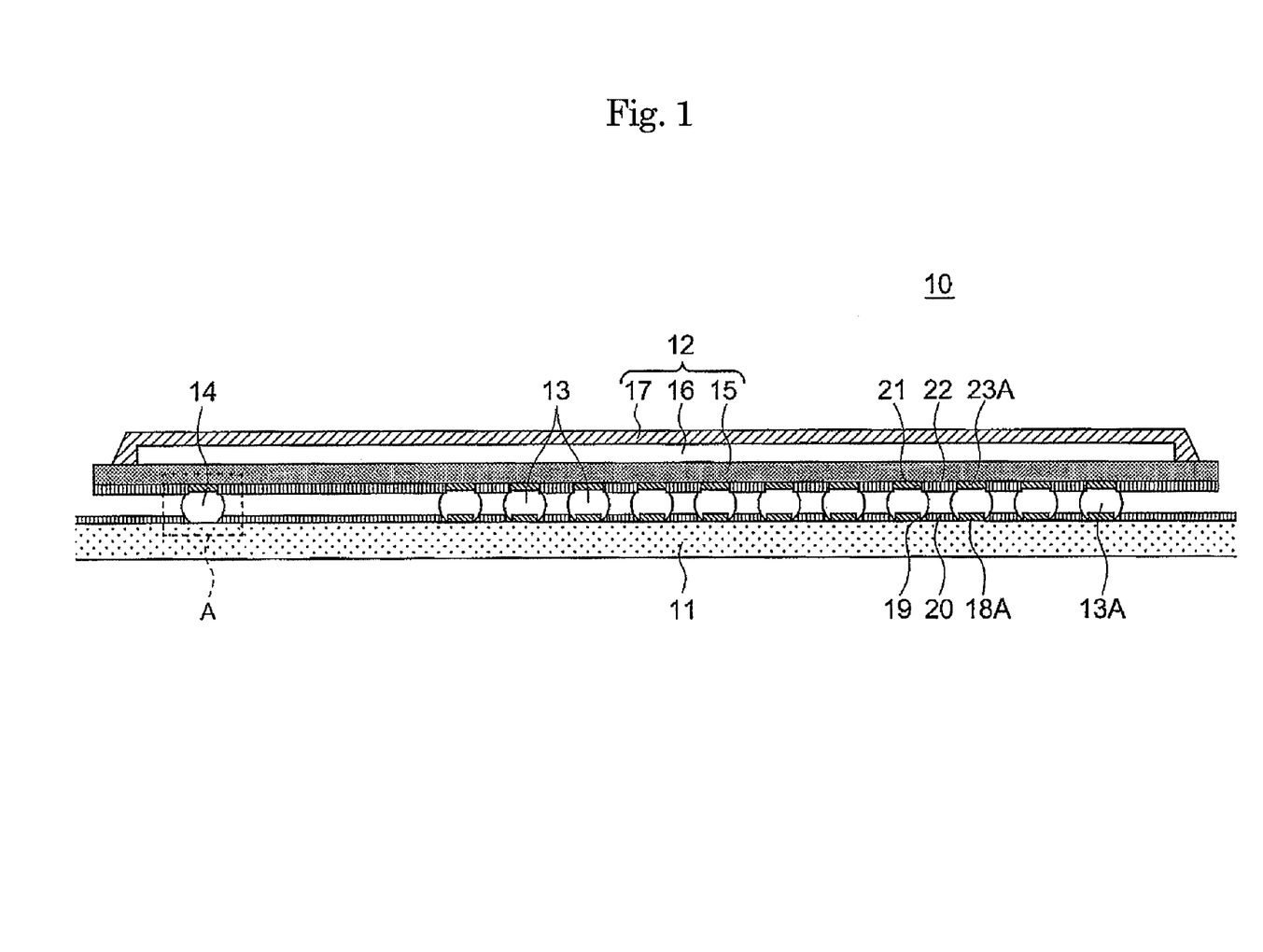
FIG. 1 is a sectional view of a BGA semiconductor device according to a first embodiment of the present invention.

Now, the present invention will be described with reference to preferred embodiments thereof. Similar reference numerals are used for designating similar constituent elements throughout the accompanying drawings for the sake of a better understanding. FIG. 1 shows a sectional view of a BGA semiconductor device according to a first embodiment of the present invention. The BGA semiconductor device of the present embodiment has a pin arrangement such as shown in FIG. 11A.

In FIG. 1, the BGA semiconductor device, generally designated by numeral 10, includes a mounting board 11 and a semiconductor package 12 mounted thereon. The semiconductor package 12 includes therein a package substrate 15, an IC chip 16 mounted on the package substrate 15, and a resin body 17 encapsulating the IC chip 16 on the package substrate 15. Between the mounting board 11 and the semiconductor package 12, there are provided an array of signal bumps 13 and a plurality of dummy bumps 14, all of which are made of solder.

Figure 2A:
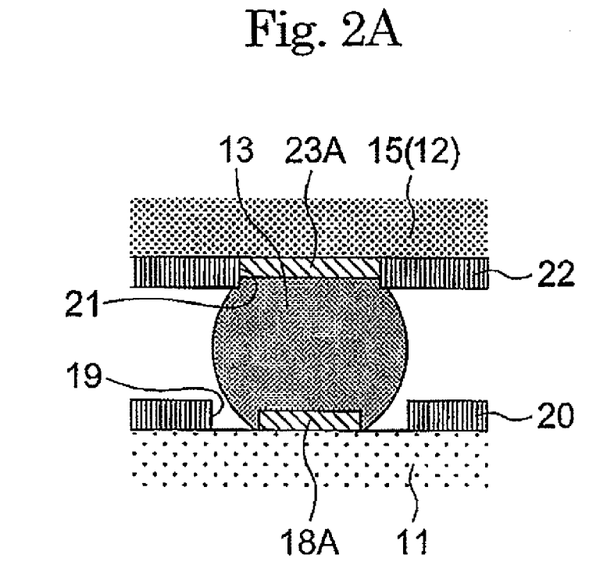
FIGS. 2A and 2B are enlarged sectional views of the vicinities of the signal bump and the dummy bump, respectively, of the BGA semiconductor device shown in FIG. 1
Figure 2B:
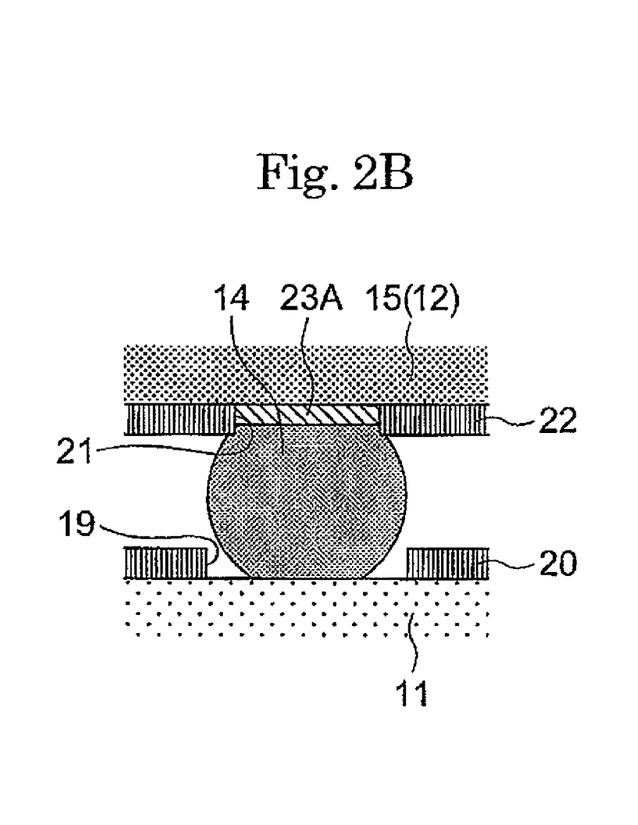

FIGS. 2A and 2B show details of vicinities of signal bumps 13 and dummy bumps 14, respectively, shown in FIG. 1. In FIG. 2A, the signal bump 13 is fixed at the top thereof onto a land (or signal electrode) 23A formed on the package substrate 15 of the semiconductor package 12, and fixed at the bottom thereof onto a land (or signal electrode) 18A formed on the mounting board 11. The land 23A is formed within an opening 21 of a solder resist film 22 formed on the package substrate 15, whereas the land 18A is formed within an opening 19 of a solder resist film 20 formed on the mounting board 11. The land 18A is somewhat smaller than the opening 19A and land 23A.

In FIG. 2B, the dummy bump 14 is fixed at the top thereof onto a land (or dummy electrode) 23A formed on the package substrate 15, and is disposed in direct contact with the insulator surface of the mounting board 11 at the bottom of the dummy bump 14 without fixing thereof. A land is not formed on the mounting board 11 at the location where the dummy bump 14 is disposed. In this configuration, the dummy bump 14 allows the surface of the mounting board 11 to slide on the bottom of the dummy bump 14, to alleviate the thermal stress caused by the difference in the thermal expansion between the mounting board 11 and the semiconductor package 12, although the dummy bump 14 has a function of increasing the mechanical strength against the bending force applied to the BGA semiconductor device 10.

Figure 3:
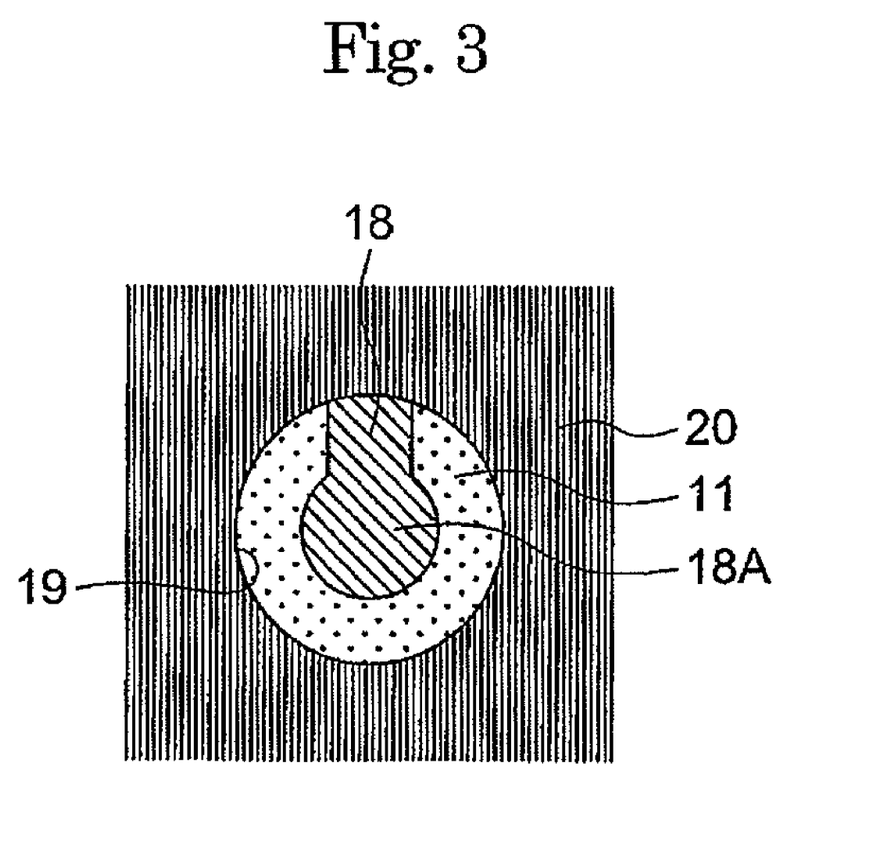
FIG. 3 is a top plan view of the signal land on the mounting board in the first embodiment.

FIG. 3 shows the detailed top plan view of the surface of the mounting board 11 in the vicinity of the signal bump 13. The mounting board 11 is covered with the solder resin film 20 having the opening 19, which exposes therefrom the land 18A. A wire or interconnection 18 extends from the land 18A on the surface of the mounting board 11, connecting the signal bump 13 to an external circuit. The mounting board 11 has thereon an array of lands 18A corresponding to the array of the signal bumps 13.

The semiconductor package 12 has thereon an array of lands 23A corresponding to an array of signal bumps 13 and dummy bumps 14. The lands 23A are bonded to the signal bumps 13 and dummy bumps 14. The diameter of the lands 23A is approximately 0.50 mm, for example.

Figure 4A:
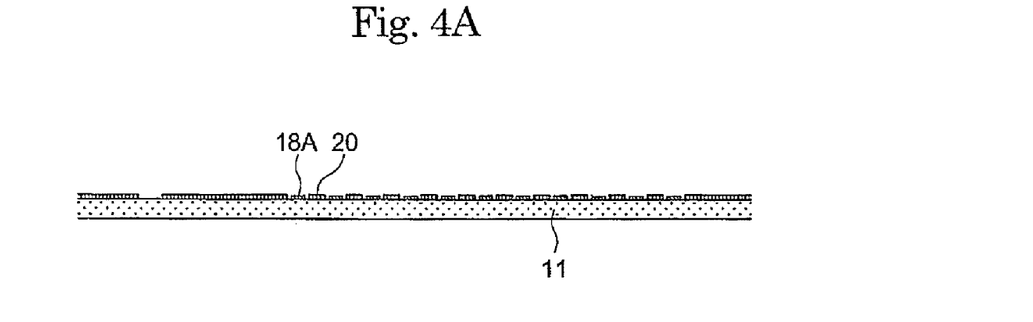
FIGS. 4A to 4F are sectional views showing consecutive steps of fabrication of the BGA semiconductor device of the first embodiment.
Figure 4B:
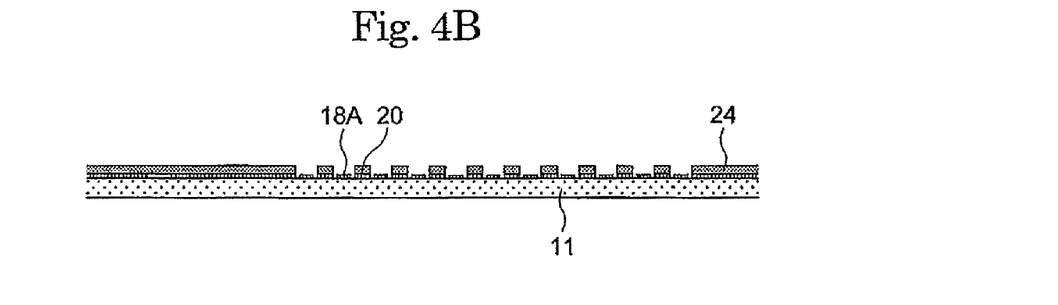

FIGS. 4A to 4F show consecutive steps of fabrication of the BGA semiconductor device of the present embodiment. As shown in FIG. 4A, lands 18A, interconnections (not shown) and a solder resist film 20 are formed on a mounting board 11. The lands 18A are formed corresponding to the locations of signal bumps 13 to be bonded, and not formed corresponding to the locations of dummy bumps 14. Subsequently, as shown in FIG. 4B, a screen-printed mask 24 having openings for exposing the lands 18A is mounted on the mounting board 11.

Figure 4C:
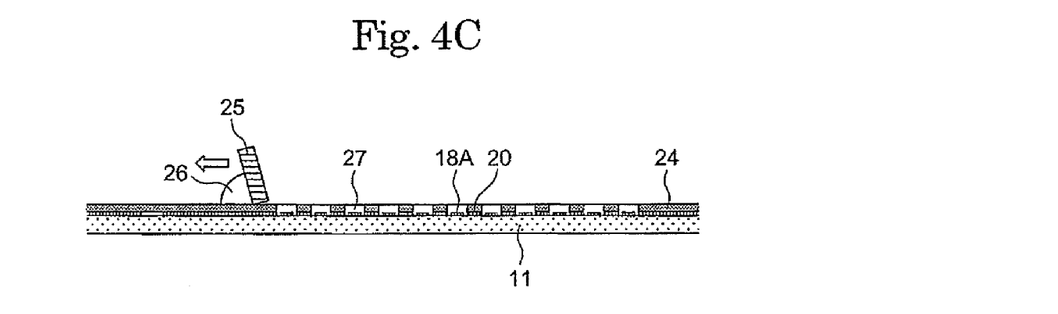
Figure 4D:
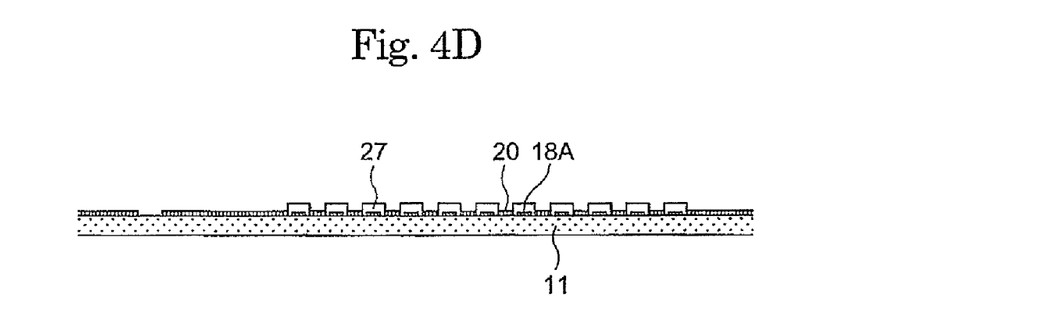
Figure 4E:
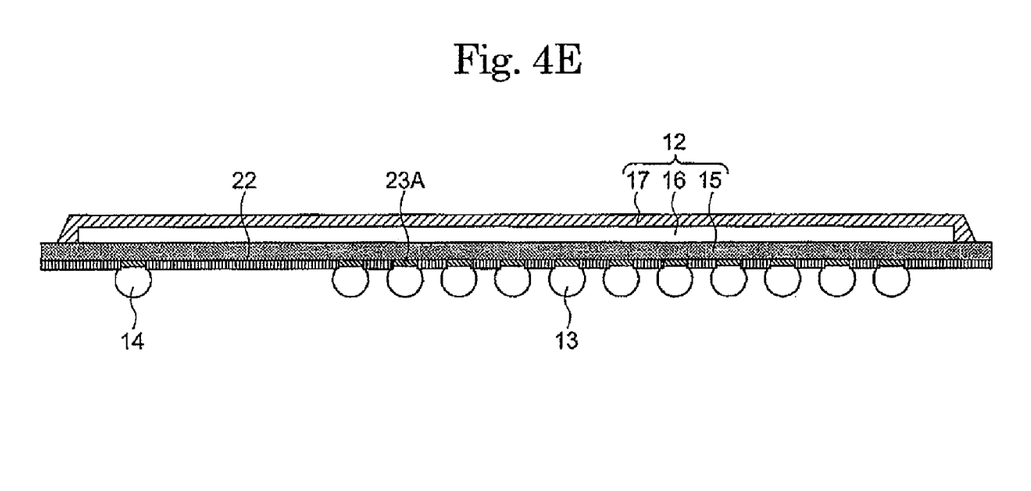
Figure 4F:
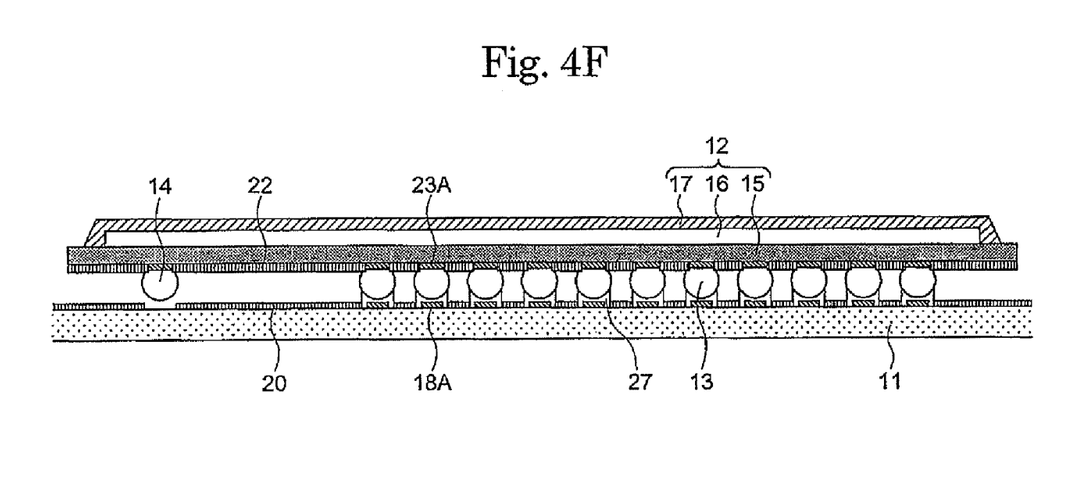

Thereafter, as shown in FIG. 4C, a solder paste film 26 is formed on the screen-printed mask 24 by using a squeezer 25, followed by forming a solder film 27 within the opening of the screen-printed mask 24. Subsequently, the screen-printed mask 24 is removed to thereby leave the solder film 27 at the locations corresponding to the signal bumps 13, excepting the locations corresponding to the dummy bumps 14. Thus, a mounting board 11 is obtained, as shown in FIG. 4D A semiconductor package 12, shown in FIG. 4E, is also prepared including a package substrate 15, an IC chip 16 and an encapsulating resin body 17. The package substrate 15 mounts at the bottom thereof an array of signal bumps 13 and dummy bumps 14 formed on the lands 23A, by using a known technique. The semiconductor package 12 is mounted on the mounting board 11, as shown in FIG. 4F, with the signal bumps 13 and the dummy bumps 14 being aligned with the solder film 27 in the openings of the solder resin film 20 on the mounting board 11. The temperature of the mounting board 11 and the semiconductor package 12 is raised by heating up to 230° C. or above, to reflow the solder. The reflow of the solder effects coupling of the signal bumps 13 to the solder film 27 to thereby obtain the structure of the BGA semiconductor device 10 shown in FIG. 1.

In the BGA semiconductor device 10 manufactured by the above fabrication steps, due to absence of the lands 18A and the solder film 27 on the mounting board 11, the dummy bumps 14 are not fixed onto the mounting board 11. Accordingly, the dummy bump allows the surface of the mounting board 11 to slide on the bottom of the dummy bump 14, to alleviate the thermal stress such as caused by a heat cycle. Thus, the break-down of the signal bumps 13 can be prevented.

With respect to the mechanical strength against the bending force, the dummy bumps 14 resist the bending stress applied in the approaching direction of the semiconductor package 11 with respect to the mounting board 11. Although the dummy bumps 14 do not resist the mechanical force in the opposite direction which acts to separate the semiconductor package 12 from the mounting board 11, such a mechanical force scarcely acts on the BGA semiconductor device 10, and hence it does not cause substantially any disadvantage.

Figure 5:
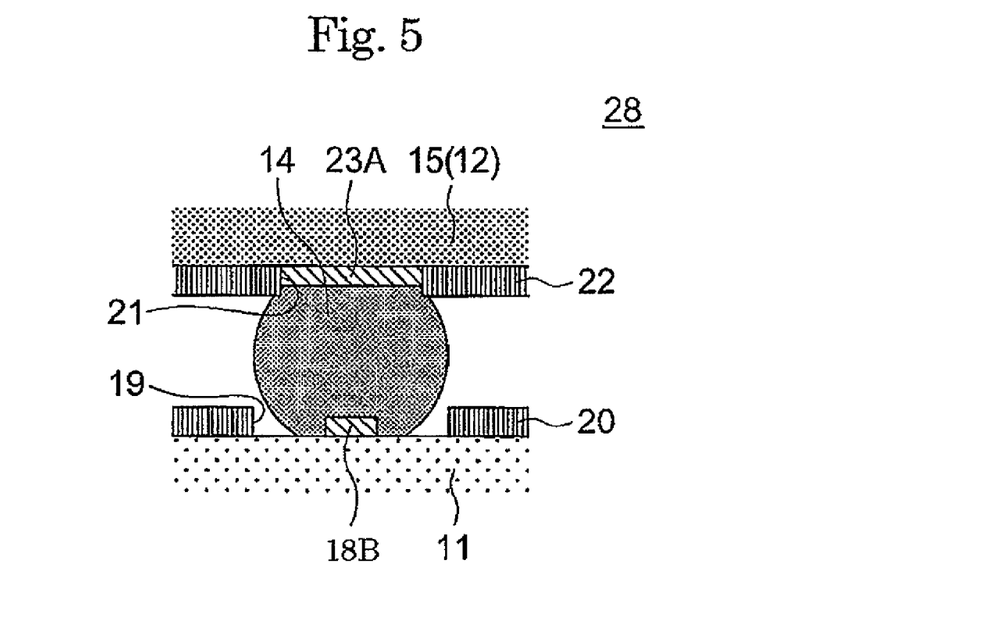
FIG. 5 is a sectional view of the vicinity of a dummy bump in a BGA semiconductor device according to a second embodiment of the present invention.

FIG. 5 shows a BGA semiconductor device according to a second embodiment of the present invention. The BGA semiconductor device 28 of the present embodiment is similar to the first embodiment except that a land 18B is disposed corresponding to each of the dummy bump 14. The land 18B mounting thereon the dummy bump 14 has a diameter of 0.30 mm which is significantly smaller than the land 18A on the signal bump 13 shown in FIG. 2A. The land 18B is exposed from an opening 19, which is similar to the opening 19 exposing therefrom the signal bump 13.

In the structure of the BGA semiconductor device 28 of the present embodiment, the land 18B has a smaller shearing strength on the bonded surface, and thus is broken before break-down of the signal bump upon application of a strong stress such as caused by a heat cycle. Accordingly, the dummy bump 14 alleviates the stress applied to the signal bump and prevents the signal bump from being broken by the stress.

Figure 6:
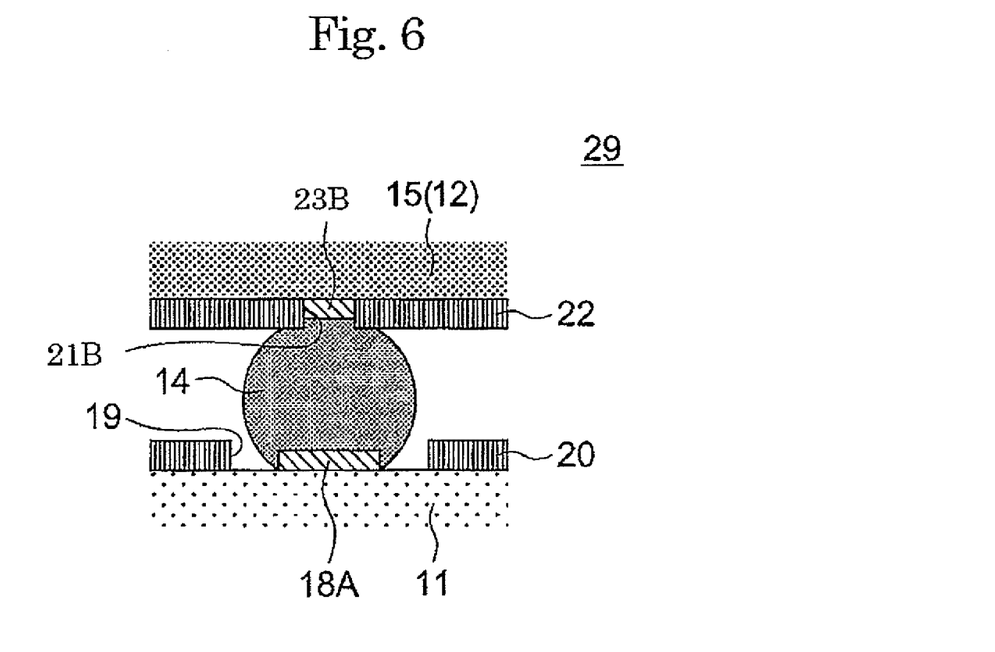
FIG. 6 is a sectional view of the vicinity of a dummy bump in a BGA semiconductor device according to a third embodiment of the present invention.

FIG. 6 shows a BGA semiconductor device according to a third embodiment of the present invention. The BGA semiconductor device 29 of the present embodiment is similar to the first embodiment except that the dummy bump 14 is fixed onto both the semiconductor package 12 and the mounting board 11. The land 18A formed for fixing the dummy bump 14 onto the mounting board 11 is similar to the land formed for fixing the signal bump onto the mounting board 11. The land 23B for fixing the dummy bump 14 onto the semiconductor package 12 has a diameter of 0.30 mm which is significantly smaller than the land 23A fixing the signal bump 13 onto the semiconductor package 12 as shown in FIG. 2A. The opening 21B for receiving the land 23B also has a diameter of 0.30 mm.

In the structure of the BGA semiconductor device 29 of the present embodiment, the land 23B has a smaller shearing strength due to the smaller bonded area with respect to the dummy bump 14, and thus the bonded surface of the land 23B is broken before the break-down of signal bump 13, upon application of a strong stress such as caused by a heat cycle. Accordingly, the dummy bump 14 alleviates the stress applied to the signal bump 13 to prevent the signal bump 13 from being broken by the stress.

Figure 7:
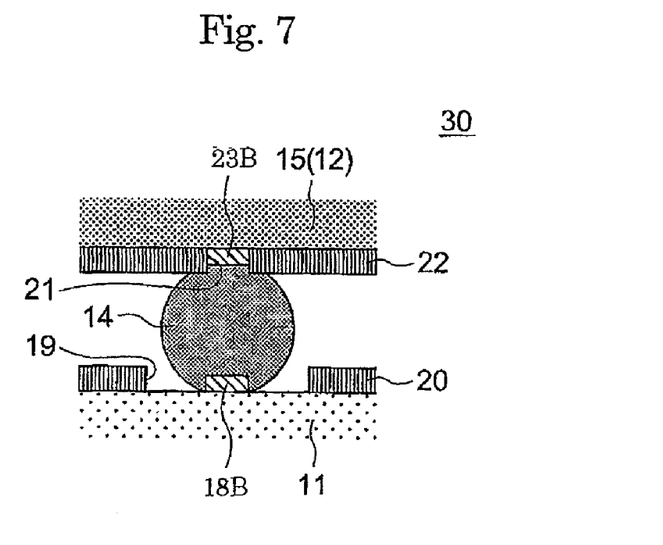
FIG. 7 is a sectional view of the vicinity of a dummy bump in a BGA semiconductor device according to a fourth embodiment of the present invention.

FIG. 7 shows a sectional view of the vicinity of a dummy bump in a BGA semiconductor device according to a fourth embodiment of the present invention. The BGA semiconductor device 30 of the present embodiment is similar to the third embodiment except that the land 18B formed on the mounting board 11 for fixing the dummy bump 14 has a diameter of 0.30 mm, which is significantly smaller than the diameter of the land 23A for the dummy bump 14 and the signal bump 13 in the fourth embodiment. The BGA semiconductor device has an advantage similar to the above embodiments.

Samples of the BGA semiconductor devices of the second to fourth embodiments were manufactured, wherein the diameters of the lands (signal electrodes) 18A and 23A for the signal bumps 13 were set at 0.20 to 0.50 mm with a step of 0.10. The diameters of the lands (dummy electrodes) 18B and/or 23B for the dummy bumps 14 were changed so as to obtain the bonded area ratio of the dummy bump to the signal bump, which allows the lifetimes of the dummy bumps 14 to be equal to or below 1/10 of the lifetime of the signal bumps 13 in terms of the shearing strength. The results obtained for these samples are tabulated in Table-2 and also plotted on the graph shown in FIG. 8.

TABLE 2

| Land diameter of signal bump (mm) | Bonding area ratio (%) |
|---|---|
| 0.50 | 35.0 or below |
| 0.40 | 42.1 or below |
| 0.30 | 53.8 or below |
| 0.20 | 83.5 or below |

As understood from the above table and FIG. 8, it is concluded that it is preferable that, for the case of the signal land having a diameter of 0.50 mm, the area ratio of the dummy electrode to the signal electrode be 35.0 or less in order to obtain a significant difference between the lifetimes, i.e., to obtain a lifetime ratio of 1/10 or below in terms of the shearing strength.

Figure 8:
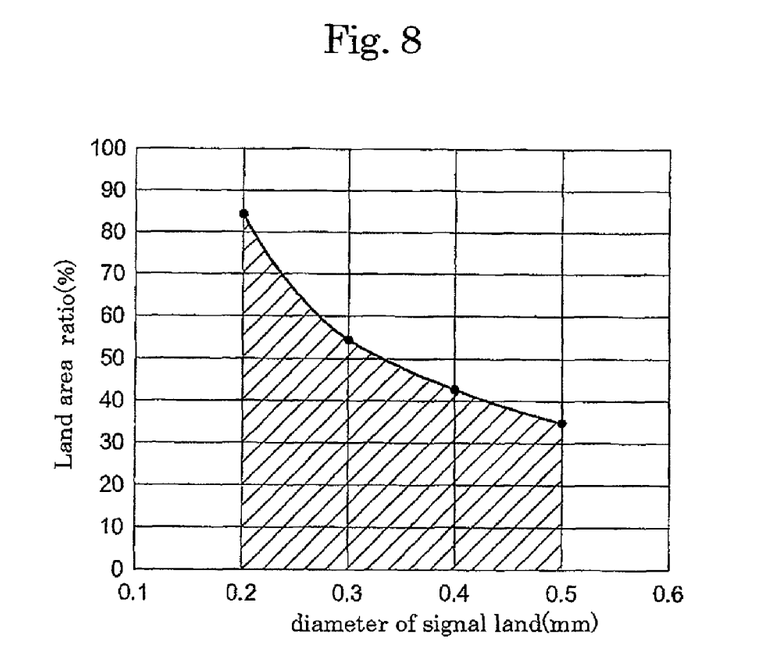
FIG. 8 is a graph showing the relationship between the diameter of the signal land and the preferred land ratio of the signal land to the dummy land.

As understood from the above table and FIG. 8, it is concluded that it is preferable that, for the case of the signal land having a diameter of 0.50 mm, the area ratio of the dummy electrode to the signal electrode be 35.0 or less in order to obtain a significant difference between the lifetimes Similarly, it is concluded that it is preferable that, for the case of the signal land having a diameter of 0.40 mm, the area ratio of the dummy electrode to the signal electrode be 42.1 or less in order to obtain a significant difference between the lifetimes.

Similarly, it is concluded that it is preferable that, for the case of the signal land having a diameter of 0.30 mm, the area ratio of the dummy electrode to the signal electrode be 53.8 or less in order to obtain a significant difference between the lifetimes.

Similarly, it is concluded that it is preferable that, for the case of the signal land having a diameter of 0.20 mm, the area ratio of the dummy electrode to the signal electrode be 83.5 or less in order to obtain a significant difference between the lifetimes.

Figure 9:
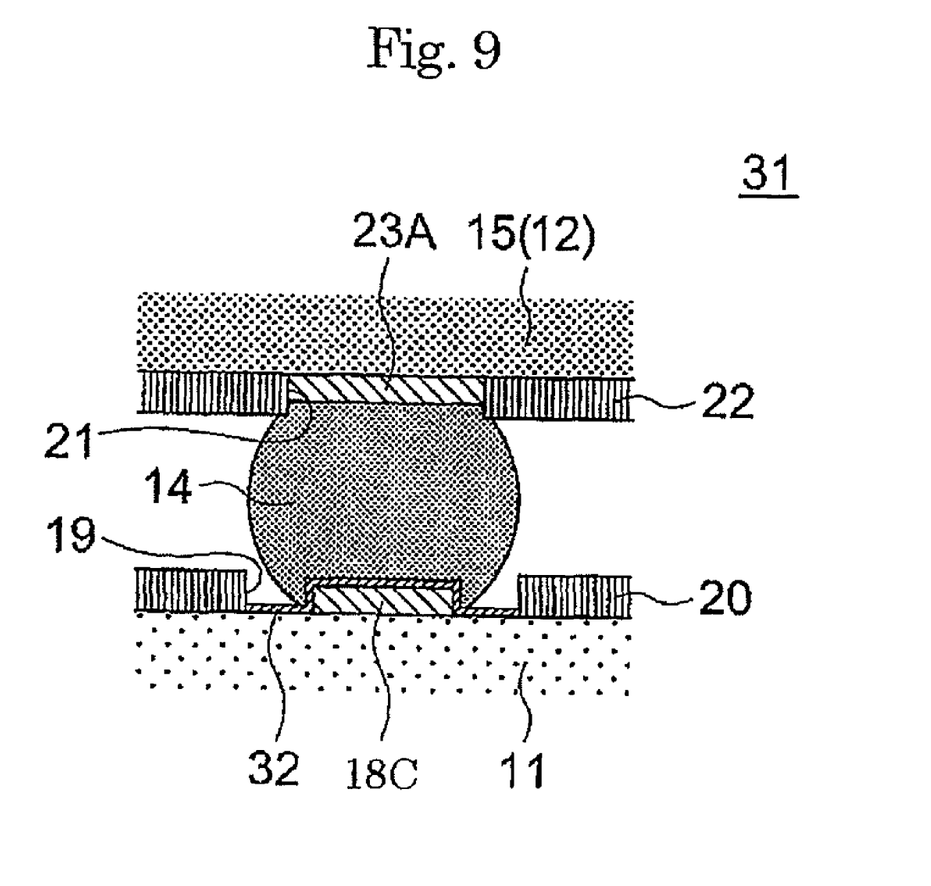
FIG. 9 is a sectional view of the vicinity of a dummy bump in a BGA semiconductor device according to a fifth embodiment of the present invention.

FIG. 9 shows a sectional view of the vicinity of a dummy bump in a BGA semiconductor device according to a fifth embodiment of the present invention. The BGA semiconductor device of the present embodiment is similar to the first embodiment except that a land 18C is formed on the mounting board 11 for the dummy bump 14, and is covered with a coating film 32 so that the dummy bump 14 is not bonded onto the land 18C. The coating film 32 may be made of an insulator resin or a fat. The advantage of the present embodiment is similar to the first embodiment or other embodiments.

Figure 10A:
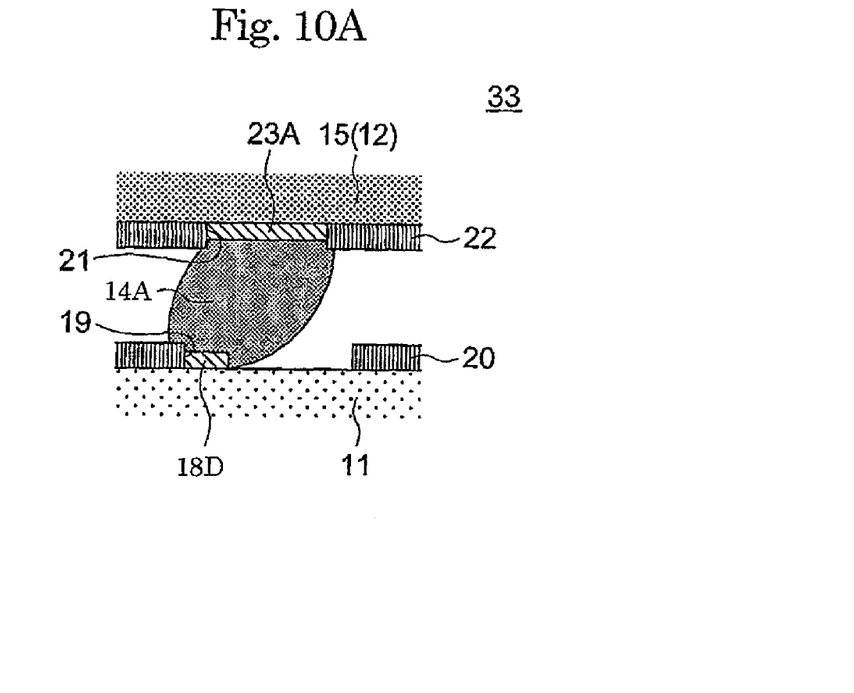
FIGS. 10A and 10B are a sectional view and a top plan view of the vicinity of a dummy bump in a BGA semiconductor device according to a sixth embodiment of the present invention.
Figure 10B:
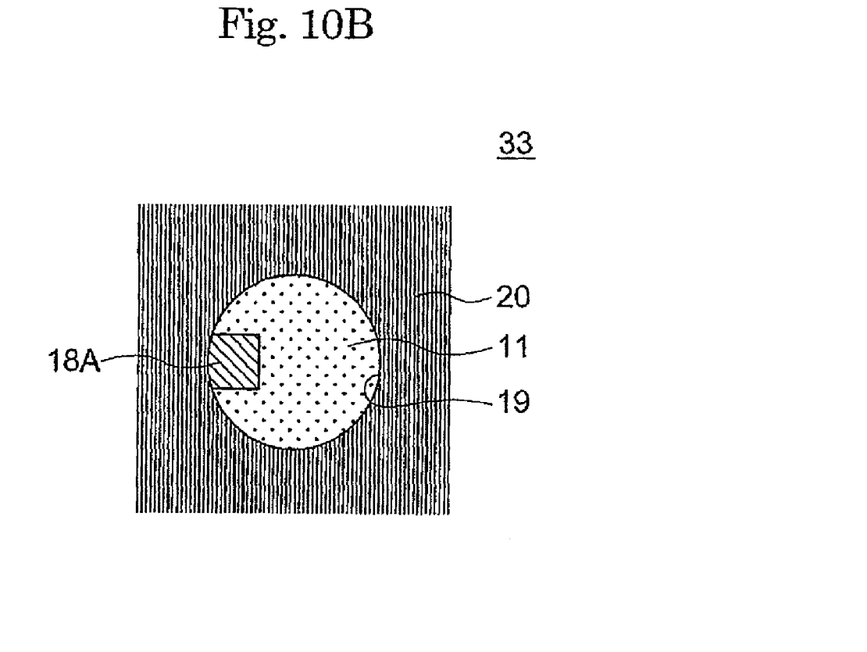

FIG. 10A show a sectional view of the vicinity of a dummy bump 14A in a BGA semiconductor device 33 according to a sixth embodiment of the present invention, whereas FIG. 10B shows the top plan view of the mounting board 11 in the vicinity of the dummy bump 14A. The land 18D formed on the mounting board 11 for the dummy bump 14A has a diameter of 0.30 mm, and is eccentric with respect to the opening 19 of the solder resist film 20. This configuration results in that the shearing strength at the bottom of the dummy bump 14A is smaller than the shearing strength at the bottom of the signal bump. The advantage of the present embodiment is similar to those of the second to fifth embodiments.

Since the above embodiments are described only for examples, the present invention is not limited to the above embodiments and various modifications or alterations can be easily made therefrom by those skilled in the art without departing from the scope of the present invention. For example, the number of dummy bumps may be selected as desired, and may be one or more. The array of the signal electrodes may be arranged in a uniform arrangement or an ununiform arrangement, so long as a dummy bump can be disposed between the semiconductor package and the mounting board. The mounting board may be any type so long as the mounting board has an array of electrodes thereon.

What is claimed is:

1. A ball-grid-array (BGA) semiconductor device comprising:
a semiconductor package including a package substrate having first and second main surfaces opposing each other, an IC chip mounted on said first main surface of said package substrate, and an array of first signal electrodes formed on said second main surface of said package substrate;
a mounting board having an array of second signal electrodes, each of said second electrodes being bonded onto a corresponding one of said first signal electrodes via a signal bump; and
a dummy bump intervening between said second main surface of said package substrate of said semiconductor package and said mounting board, the dummy bump being fixed onto one of said package substrate and said mounting board and substantially not fixed onto the other of said package substrate and said mounting board, wherein the dummy bump is allowed to slide on a surface of the other of said package substrate and said mounting board.

2. The semiconductor device as claimed in claim 1, wherein said dummy bump is fixed onto said package substrate.

3. The semiconductor device as claimed in claim 2, wherein said semiconductor package further having a dummy electrode on said second main surface of said package substrate of said semiconductor package, said dummy bump is fixed onto said dummy electrode on said package substrate of said semiconductor package.

4. The semiconductor device as claimed in claim 3, wherein said semiconductor package further includes a first insulating film which covers said second main surface of said package substrate with leaving at least a part of each of said first electrodes and said dummy electrode uncovered.

5. The semiconductor device as claimed in claim 4, wherein said first insulating film includes a solder resist film.

6. A ball-grid-array (BGA) semiconductor device comprising:
a semiconductor package including a package substrate having first and second main surfaces opposing each other, an IC chip mounted on the first main surface of the package substrate, an array of first signal electrodes and a dummy electrode each formed on the second main surface of the package substrate;
a mounting board having a board member and an array of second signal electrodes provided on the board member, each of the second electrodes being bonded onto a corresponding one of the first signal electrodes via a signal bump; and
a dummy bump intervening between the second main surface of the package substrate of the semiconductor package and the mounting board, the dummy bump being fixed to the dummy electrode formed on the second main surface of the package substrate of the semiconductor package and substantially not fixed to the mounting board, the dummy bump being in direct contact with a first portion of the board member of the mounting board without connection to any electrode, and the dummy bump being allowed to slide directly on a surface of the first portion of the board member of the mounting board.

7. The semiconductor device as claimed in claim 6, wherein the mounting board further has an insulating film which covers the mounting board with leaving a part of each of the second electrodes and the first portion of the mounting member.

* * * * *